(12) United States Patent
Frankewich, Jr.

(10) Patent No.: US 6,215,314 B1
(45) Date of Patent: Apr. 10, 2001

(54) WIRE BREAK LOCATOR AND METHOD OF USE

(75) Inventor: Walter J. Frankewich, Jr., Maryville, TN (US)

(73) Assignee: Radio Systems Corporation, Knoxville, TN (US)

( * ) Notice: Subject to any disclaimer, the term of this patent is extended or adjusted under 35 U.S.C. 154(b) by 0 days.

(21) Appl. No.: 09/300,305

(22) Filed: Apr. 27, 1999

(51) Int. Cl.[7] .................................................. G01R 31/28
(52) U.S. Cl. .......................................... 324/529; 324/527
(58) Field of Search .................................. 324/529, 534, 324/66, 67, 512, 520, 527, 528, 543

(56) References Cited

U.S. PATENT DOCUMENTS 5,914,608 * 6/1999 Wissman ............................. 324/529

* cited by examiner

Primary Examiner—Safet Metjahic
Assistant Examiner—J Kerveros
(74) Attorney, Agent, or Firm—Pitts & Brittian, P.C.

(57) ABSTRACT

A system and method for locating a break in a single conductor unshielded wire is provided. The system includes a transmitter generating two continuous wave radio frequency signals attached to each of the wire segments of a broken wire. Each signal has a unique frequency and is transmitted in opposite directions around the wire. When a locator is operated near a wire transmitting one of the signals, an audible tone of the appropriate frequency is generated. The volume of the tone decreases as the locator is moved closer to the break. In this manner, the operator can determine the location of the break within a margin of about six inches. Accordingly, no unnecessary digging is required to locate the break in the wire.

8 Claims, 3 Drawing Sheets

WIRE BREAK LOCATOR AND METHOD OF USE

CROSS-REFERENCE TO RELATED APPLICATIONS

Not Applicable

STATEMENT REGARDING FEDERALLY SPONSORED RESEARCH OR DEVELOPMENT

Not Applicable

BACKGROUND OF THE INVENTION

1. Field of Invention

This invention relates to a system for locating a break in a single conductor wire. More particularly, this invention relates to a system for locating a break in a buried single conductor wire such as used with conventional electronic pet confinement systems.

2. Description of the Related Art

Numerous wire bounded pet containment systems have been installed in the United States. The wire defines the perimeter of the area in which the pet is to be confined. A transmitter generates a low strength radio frequency signal which is carried by the wire. A receiver worn by the pet to be confined is tuned to the frequency of the signal carried by wire. Should the pet stray too close to the boundary, a correction signal is generated.

The wire will typically provide many years of service; however, it is subject to potential breakage. Generally, the wire is an 18 gauge, insulated, unshielded, stranded wire. For most installations, the wire is buried between two (2) and six (6) inches underground. The length of the wire may vary between less than 100 yards for a small enclosure and more than 1000 yards for a large enclosure. Accordingly, considerable time and expense is invested in burying the wire and landscaping over the buried wire. Should the wire suffer a break, finding the location of the break is nearly impossible without digging up the entire wire. Further, unnecessary digging to visually inspect the wire increases the risk of additional damage to the wire.

Various devices have been developed for locating breaks in underground wires. Often an ohmmeter which measures the resistance of a wire is used. However, variations in the depth at which the wire is buried lead to fluctuations in the measured resistance. In the case of the pet confinement system, the wire depth can vary without adversely affecting the performance of the pet confinement function rendering the ohmmeter ineffective in locating a break in the buried wire.

Another device used to locate problems with underground wires is a time domain reflectometer (TDR). The TDR looks at the impedance of a wire pair, such as a twisted wire pair or coaxial cable. However, where the impedance of the wire is not constant, the reading of the TDR is ambiguous. Further, the TDR is typically too expensive for the average consumer, thus limiting its use to utility and telephone companies. Accordingly, the TDR is not a viable option for detecting breaks in a single conductor wire used to bound a pet confinement area.

Yet another technique utilizes a radio frequency (RF) signal transmitted through the wire. By monitoring the radio frequency signal, it is possible to determine the approximate location of wire buried underground. However, because the wire acts as an antenna in this technique, the propagation of the RF signal does not allow a determination of a reasonably close approximation of the location of the break in the wire.

Therefore, it is an object of the present invention to provide a system for locating breaks in continuity in a wire, especially those buried underground.

It is another object of the present invention to provide a system which is inexpensive and simple for use in residential applications.

It is a further object of the present invention to provide a system for locating breaks in an unshielded single conductor wire.

It is yet another object of the present invention to provide a method for locating breaks in continuity in a wire.

BRIEF SUMMARY OF THE INVENTION

A system for locating a break in an unshielded, insulated, single conductor wire is provided. The system for locating a break in a wire, or wire break location system, measures the signal strengths of two distinct signals propagating through each of the wire segments defined by the break in a wire.

The wire break location system includes a transmitter electrically connected to both ends of a wire having a break at an undetermined location. In a typical application, the wire is buried between two and six inches underground making location of the break difficult. The transmitter generates two distinct low power, continuous wave (CW) radio frequency (RF) signals. A first CW-RF signal is transmitted in a first direction around the wire. Simultaneously, a second CW-RF signal is transmitted in the opposite direction through the wire. Because of the break in the wire, the first signal only propagates through the portion of the wire between the transmitter and the break in the first direction. Similarly, the second signal only propagates through the portion of the wire between the transmitter and the break in the second direction. Each signal radiates outwardly from the wire to a range corresponding to the signal strength. Proximate the end of each wire segment, each of the first signal and the second signal begins to attenuate providing information as to the location of the break.

A locator is tuned to receive each of the first signal and the second signal. In the preferred embodiment, the locator is an amplitude modulated (AM) radio receiver. The operator searching for the break in the wire carries the locator and follows either signal starting at the transmitter. As the operator approaches the location of the break, the signal strength of the signal being followed diminishes until the signal can longer be picked up. If the operator continues forward, the locator will pick up the other signal and the signal strength will increase as the operator moves away from the break. In this manner, the operator can determine the location of the break. By placing the locator near the ground, the location of the break can be determined within a margin of about six inches. Accordingly, no unnecessary digging is required to locate the break in the wire.

Further, a method for locating in a break in a wire is described. Two distinct CW-RF signals are generated. Each signal has a unique predetermined frequency and a signal strength selected to limit the broadcast radius of the signal to an approximate maximum range between three and six feet from the wire. The signals are transmitted in opposite directions through the wire. A locator is employed to follow a selected one of the signals along the length the wire using an audible tone corresponding the received signal generated by the locator. The volume of the audible tone decreases as a result of signal attenuation as the locator is moved toward the break.

BRIEF DESCRIPTION OF THE SEVERAL VIEWS OF THE DRAWINGS

The above-mentioned features of the invention will become more clearly understood from the following detailed description of the invention read together with the drawings in which.

DETAILED DESCRIPTION OF THE INVENTION

A system for locating a break in an unshielded, insulated, single conductor wire is illustrated generally at 10 in the figures. The system for locating a break 13 in a wire 12, or wire break location system 10, measures two distinct radio frequency signals traveling in opposite directions to locate the break 13.

Figure 1:
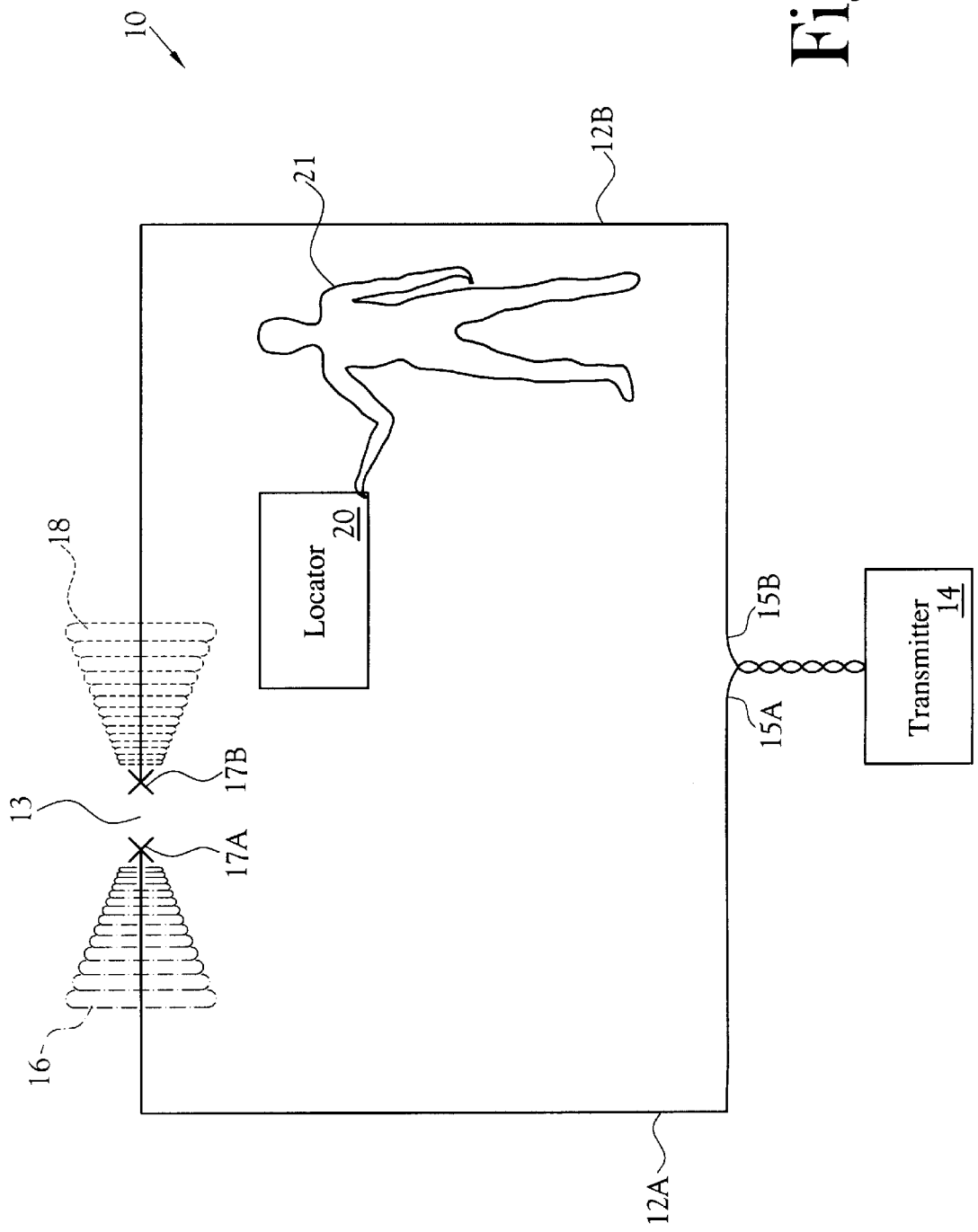
FIG. 1 is a block diagram of the wire break location system of the present invention.

FIG. 1 illustrates a block diagram of the wire break location system 10. The wire break location system 10 includes at least one transmitter 14 electrically connected to two wire segments 12A, 12B defined by an unshielded wire 12 having a break 13 at an undetermined location. Each of the first wire segment 12A and the second wire segment 12B have a first end 15 and a second end 17. The transmitter 14 is electrically connected to each of the first wire segment 12A and the second wire segment 12B. It should be noted that the first wire segment second end 17A and the second wire segment second end 17B are in close proximity. In a typical application, the wire 12 is buried between two and six inches underground making location of the break 13 difficult. The transmitter 14 generators at least two distinct continuous wave (CW) radio frequency (RF) signals. In the preferred embodiment, the transmitter 14 generates a first signal 16 having a frequency of 460 Hz and a second signal 18 having a frequency of 2 KHz. Further, each of the signals 16, 18 have a signal strength providing an approximate maximum broadcast range of between three and six feet from the wire 12. One skilled in the art will recognize that other signals may be used provided that the signals have sufficient frequency separation so as to be readily distinguishable from one another.

Figure 2:
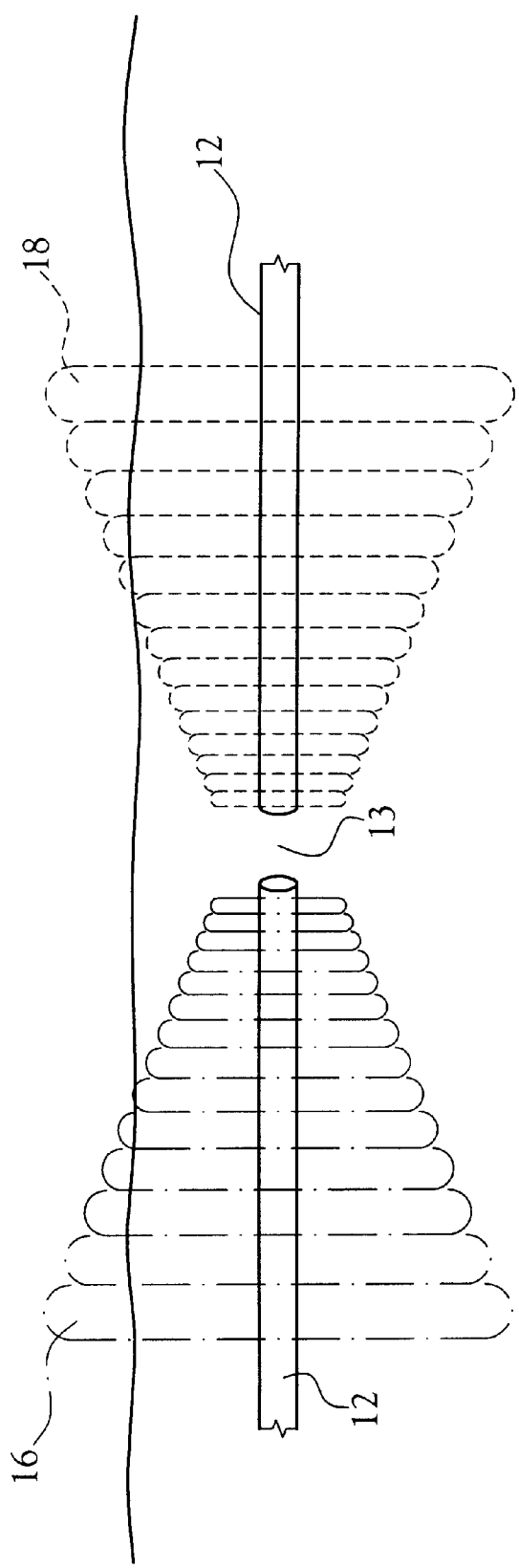
FIG. 2 is a representation of the break in an underground wire showing the continuous wave signals in this vicinity.

The first CW-RF signal 16 is transmitted through the first wire segment 12A. Simultaneously, the second CW-RF signal 18 is transmitted through the second wire segment 12B. Each signal 16, 18 radiates outwardly from the wire 12 to a range corresponding to the signal strength. Proximate the break 13 in the wire 12, the first signal 16 and the second signal 18 converge, as indicated in FIG. 2. In an alternate embodiment, a single signal generator generates a single signal having a specified frequency. The single signal is propagated through a wire segment 12 and the signal attenuation is measured to approximate the location of the end of the wire segment 12. It will be noted that using a single signal is less precise than using two signals having unique frequencies; however, the single signal embodiment allows the location of the opposing end of a wire segment 12.

Returning now to FIG. 1, the wire break locator system 10 further includes a locator 20 tuned to receive each of the first signal 16 and the second signal 18. The locator 20 is an A.M. radio receiver tuned to a place in the A.M. band where no local radio stations operate. In the illustrated embodiment, the locator 20 is tuned to 530 KHz because very few broadcast stations operate that low in frequency. The operator 21 searching for the break 13 in the wire 12 carries the locator 20 and follows either signal 16, 18 starting at the transmitter 14. The locator 20 receives the CW-RF signal which is heard as a tone of the appropriate frequency. As the operator 21 approaches the location of the break 13, the volume of the tone decreases as a result of the attenuation of the CW-RF signal. Once the operator 21 passes the break 13, the second signal is received by the locator 20 and the tone changes to that of the other frequency with the volume increasing as the operator 21 moves away from the break 13. Because of signal attenuation, the location of the break 13 can be more accurately located when the locator 20 is closer to the wire 12. Therefore, for optimum results, the locator 20 is operated close to the ground, preferably within five (5) inches of the surface. In this manner, the operator can determine the location of the break 13 within a margin of about six (6) inches. Accordingly, no unnecessary digging is required to locate the break 13 in the wire 12. One skilled in the art will recognize that the locator 20 can include various convenience features, including an extended handle to improve operation ease without interfering with the objects and advantages of the present invention.

Figure 3:
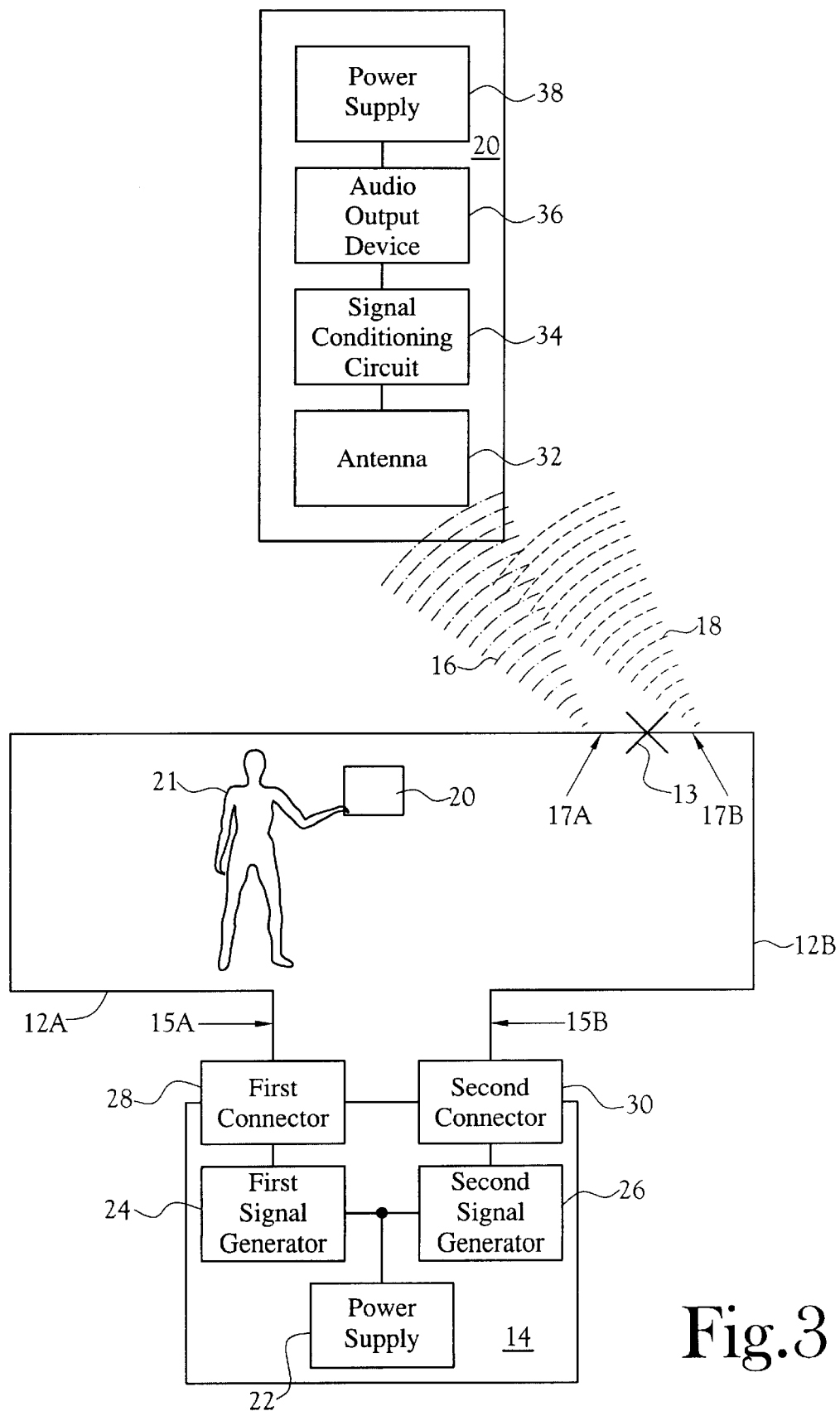
FIG. 3 is a block diagram of the wire break location system of the present invention incorporating a conventional pet containment system.

FIG. 3 illustrates a block diagram of one embodiment of the transmitter 14 and the locator 20 of the wire break location system 10. The transmitter includes a power supply 22 electrically connected to a first signal generator 24 and a second signal generator 26. Each signal generator 24, 26 produces a CW-RF signal having a unique, predetermined frequency. The first signal generator 24 is electrically connected to a first connector 28 configured to provide a releasable electrical connection with one of the wire segments 12. Similarly, the second signal generator 26 is electrically connected to a second connector 30 configured to provide a releasable electrical connection with the other of the wire segments 12. The signal 16 from the first signal generator 24 propagates through the first wire segment 12A while the signal 18 from the second signal generator 26 propagates through the second wire segment 12B. One skilled in the art will recognize that other configurations for the transmitter 14 can be used without interfering with the objects of the present invention including a two-piece transmitter allowing the two signal generators 24, 26 to be separated for use with a broken wire where the connection points are not closely proximate. Further, the wire break locator transmitter can be incorporated into a conventional pet confinement transmitter such that the wire break location function or the pet confinement function is user selectable as needed.

A locator 20 includes an antenna 32 for receiving the first signal 16 and the second signal 18. In the illustrated embodiment, the antenna 32 is electrically connected to a signal conditioning circuit 34 for amplifying, filtering, and demodulating the received signal. A audio output device 36 produces an audible tone corresponding to the frequency of the received signal. In the preferred embodiment, the audio output device 36 is a standard coil and magnet speaker capable of reproducing audible frequencies. One skilled in the art will recognize that other audio output devices 36 could be used.

In operation, the locator 20 is carried in a single direction around the wire 12, allowing the operator 21 to follow either one of the CW-RF signals 16, 18. In the illustrated embodiment, the operator is depicted following the first signal 16 by listening to the first tone. As the operator 21 approaches the location of the break 13, the volume of the first tone decreases indicating the end of the wire segment 12A, 12B signified by the break 13. Continuing past the break 13 results in the operator 21 hearing the second tone with volume increasing as the operator 21 moves farther away from the break 13.

Finally, a method for locating a break in a wire is described. Two distinct CW-RF signals are generated. Each signal has a unique predetermined frequency and a signal strength selected to limit the broadcast radius of the signal to an approximate maximum range between three and six feet from the wire. A first signal is transmitted through first wire segment and the second signal is transmitted through the second wire segment. A locator tuned to receive the CW-RF signals is employed to produce an audible tone corresponding to the frequency of the received signal thereby allowing the operator to follow a selected one of the signals along the wire to the break. The volume of the received decreases to indicate the end of the wire segment resulting from the break. Continuing past the break results in the tone changing and the volume increasing as the locator moves away from the break.

While a preferred embodiment has been shown and described, it will be understood that it is not intended to limit the disclosure, but rather it is intended to cover all modifications and alternate methods falling within the spirit and the scope of the invention as defined in the appended claims.

Having thus described the aforementioned invention, I claim:

1. A system for locating a break in a single conductor wire defining a first wire segment and a second wire segment separated by the break, said system comprising:
   (a) a first transmitter in electrical communication with a first wire segment, said first transmitter generating a first signal having a first predetermined frequency;
   (b) a second transmitter in electrical communication with the second wire segment which is not substantially parallel to said first segment, said second transmitter generating a second signal having a second predetermined frequency unique from said first predetermined frequency; and
   (c) a receiver for receiving each of said first signal and said second signal, said receiver indicating a location of the break based upon a transition from said first predetermined frequency to said second predetermined frequency.

2. The system of claim 1 wherein said receiver is an amplitude modulated radio frequency receiver.

3. The system of claim 1 wherein said receiver includes an audio output device for generating an audible tone corresponding to each of said first signal and said second signal.

4. A system for locating a break in a wire defining a first wire segment and a second wire segment separated by the break, said system comprising:
   a first signal generator for generating a first signal having a predetermined frequency, said first signal generator being electrically connected to a first wire segment;
   a second signal generator for generating a second signal having a predetermined frequency unique from said first signal predetermined frequency, said second signal generator being electrically connected to a second wire segment which is not substantially parallel to said first segment;
   a transmitter power source electrically connected to each of said first signal generator and said second signal generator;
   an antenna for receiving each of said first signal and said second signal as a received signal;
   a signal conditioning circuit for amplifying, filtering, and demodulating said received signal;
   an audio output device electrically connected to said signal conditioning circuit, said audio output device generating an audible tone corresponding to said received signal; and
   a receiver power supply electrically connected to said signal conditioning circuit said audio output device.

5. The system of claim 4 wherein said signal conditioning circuit includes an amplitude modulated radio frequency receiver.

6. The system of claim 4 further comprising a first connector for releasably securing the first wire segment in electrical connection with said first signal generator and a second connector for releasably securing the second wire segment in electrical connection with said second signal generator.

7. The system of claim 4 wherein each of said first signal and said second signal is a continuous wave radio frequency signal.

8. A method for detecting the location of a break in a wire defining a first wire segment and a second wire segment separated by the break, said method comprising the steps of:
   (a) generating a first signal having a first predetermined frequency;
   (b) generating a second signal having a second predetermined frequency unique from said first predetermined frequency;
   (c) transmitting said first signal through a first wire segment;
   (d) transmitting said second signal through a second wire segment which is not substantially parallel to said first segment;
   (e) receiving either of said first signal or said second signal as received signal having a frequency corresponding to either of said first signal or said second signal; and
   (f) locating a break in the single conductor wire when said received signal frequency transitions between said first predetermined frequency and said second predetermined frequency.

* * * * *